United States Patent [19]
Takahashi

[11] Patent Number: 5,686,750
[45] Date of Patent: Nov. 11, 1997

[54] POWER SEMICONDUCTOR DEVICE HAVING IMPROVED REVERSE RECOVERY VOLTAGE

[75] Inventor: Mitsuasa Takahashi, Tokyo, Japan

[73] Assignee: Koshiba & Partners, Nigashi-Kanda, Japan

[21] Appl. No.: 639,433

[22] Filed: Apr. 29, 1996

Related U.S. Application Data

[63] Continuation of Ser. No. 341,318, Nov. 17, 1994, abandoned, which is a continuation of Ser. No. 952,292, Sep. 28, 1992, abandoned.

[30] Foreign Application Priority Data

Sep. 27, 1991 [JP] Japan ..................... 3-248575

[51] Int. Cl.⁶ .............. H01L 29/76; H01L 29/94; H01L 31/062
[52] U.S. Cl. .............. 257/328; 257/337; 257/339
[58] Field of Search .............. 257/328, 334, 257/337, 339, 409, 329

[56] References Cited

U.S. PATENT DOCUMENTS

| | | |
|---|---|---|
| 5,170,241 | 12/1992 | Yoshimura et al. ........... 257/339 |
| 5,184,204 | 2/1993 | Mihara et al. ........... 257/341 |
| 5,191,395 | 3/1993 | Nishimura ........... 257/328 |
| 5,430,314 | 7/1995 | Yilmaz ........... 257/328 |

*Primary Examiner*—Steven H. Loke

[57] ABSTRACT

A vertical field effect transistor comprises a MOSFET cell zone which is formed in a principal surface of an N-type semiconductor substrate and in which a plurality of MOSFET cells are formed and connected in parallel with one another. A gate electrode pad and a source electrode pad are formed in the principal surface of the semiconductor substrate, separately from the MOSFET cell zone. A drain electrode pad is formed on a rear surface of the semiconductor substrate. A plurality of diodes are formed in the principal surface of the semiconductor substrate and arranged to form at least one array of diodes along an outer periphery of the MOSFET cell zone. An N-type region of each of the diodes is formed of the N-type semiconductor substrate itself and a P-type region of each of the diodes is connected to an electrode which is connected to a source electrode of the MOSFET cells.

2 Claims, 5 Drawing Sheets

POWER SEMICONDUCTOR DEVICE HAVING IMPROVED REVERSE RECOVERY VOLTAGE

This application is a continuation of application Ser. No. 08/341,318, filed Nov. 17, 1994, now abandoned, which is a continuation of Ser. No. 07/952,292 filed Sep. 28, 1992, now abandoned.

BACKGROUND OF THE INVENTION

1. Field of the Invention

The present invention relates to a power semiconductor device of a vertical field effect transistor type, and more specifically to a vertical field effect transistor having an improved safe operation zone.

2. Description of Related Art

One typical conventional vertical field effect transistor includes a number of parallel-connected small vertical MOSFET (metal-oxide-semiconductor field effect transistor) cells.

If the vertical field effect transistor is of the N channel type, the vertical field effect transistor is formed in a semiconductor chip including an $N^+$ drain layer and an $N^-$ epitaxial drain layer formed on the $N^+$ drain layer. Both of these layers are formed in common to all the small vertical MOSFET cells. For each of the small vertical MOSFET cells, a P type base region is formed in the epitaxial layer of the surface of the semiconductor chip, and an $N^+$ source region is also formed in the base region. A portion of the $N^-$ epitaxial layer in which the base region is not formed constitutes a drain region. A gate insulator film is formed at least on the base region between the source region and the drain region, and a gate electrode is formed on the gate insulator film so as to create and control a channel in a surface area of the base region between the source region and the drain region. Actually, the gate electrode is in the form of a mesh covering the gate insulator film.

In operation, a source electrode of the vertical MOSFET Cells (connected to the source regions) is grounded, and a drain electrode (a back electrode of the semiconductor chip) is biased to a positive voltage. Under this condition, if a positive voltage is applied to the gate electrodes, an N-type inverted layer (channel) is formed at a surface region of the base region under the gate electrode, so that an electric current flows from the drain electrode through the $N^+$ semiconductor layer, the $N^-$ epitaxial layer, the N-type inverted layer, and the source region to source electrode. Accordingly, if a load is connected between an positive voltage supply and the drain electrode, the load is driven. In addition, if the voltage applied to the gate electrode is lowered or decreased, the current can be shut off, so that it is possible to stop the driving of the load. Namely, a semiconductor switch can be realized.

The above mentioned vertical field effect transistor has been designed at a desired value on the order of 1 ampere to 10 amperes. Accordingly, since a large current flows through the vertical field effect transistor, there is a risk of being broken due to heat excessively generated in the semiconductor chip.

In order to prevent the heat breakdown, an active zone in which all the small vertical MOSFET cells are formed is completely surrounded by a so called peripheral zone, which acts to ensure a withstanding voltage of the vertical field effect transistor. In addition, in order to supply a voltage to the gate electrode and the source region of all the small vertical MOSFET cells, a gate pad and a source pad are formed in the active zone. The gate pad has a gate finger extending therefrom so as to prevent increase of a gate series resistance. The peripheral zone includes another gate finger provided adjacent to the active zone and connected to the gate pad, and a so called field plate formed in the outside of the gate finger. Under each of the peripheral zone and the gate pad having the gate finger, no small vertical MOSFET cell is formed.

In the above mentioned construction, a number of small vertical MOSFET cells are formed in the semiconductor chip other than the peripheral zone, the gate pad having the gate finger and the source pad Therefore, small vertical MOSFET cells are formed adjacent to an inner edge of the peripheral zone, and also, small vertical MOSFET cells are formed adjacent to a periphery of each of the gate pad, the gate finger and the source pad. In a semiconductor region under the gate pad, the gate finger of the gate pad, and the gate finger and the field plate of the peripheral zone, a P-well is formed in order to facilitate extension of the depletion layer and to prevent deterioration of the withstanding voltage.

With this arrangement, the field plate of the peripheral zone is electrically connected to the source electrode, so that the P-well of the peripheral zone is biased to the same potential as that of the source electrode. In addition, the P-well under the gate pad and the gate finger extending from the gate pad can be biased to the same potential as that of the source electrode or to a floating potential. In ordinary cases, in order to make the P-well under the gate pad and the gate finger extending from the gate pad at the same potential as that of the source electrode, the P-well of the peripheral zone, the P-well under the gate pad and the P-well under the gate finger extending from the gate pad are formed in a continuous pattern, and connected to the field plate so that the source potential is applied to these P-wells.

In the above mentioned vertical field effect transistor, the P-well is formed adjacent to the periphery of the MOSFET cell zone, and is connected to the source electrode (the field plate of the peripheral zone) only at a position remote from the the MOSFET cell zone. Therefore, an operation resistance in the P-well in the proximity of the MOSFET cell zone is considerably larger than that in the P-well direct under the field plate of the peripheral zone.

Therefore, in application cases in which a parasitic diode between the source and the drain (an anode is formed of the P-well and the P-base, and an cathode is formed of the $N^+$ drain layer and the $N^-$ epitaxial drain layer) is reversely recovered, since the operation resistance in the P-well adjacent to the MOSFET cell zone is large, minority carriers injected into the $N^-$ drain (holes in this case) cannot be effectively drawn out, and therefore, a portion of the minority carriers (holes) flows into the MOSFET cells positioned along the periphery of the adjacent MOSFET cell zone, so that the flowing-in carriers becomes a base current of a parasitic NPN transistor of the MOSFET cells (an emitter is formed of the $N^+$ source, a base is formed of the P-base, and a collector is formed of the $N^+$ drain and the $N^-$ drain), so as to turn on the parasitic NPN transistor. As a result, a current concentration occurs, and therefore, a thermal destroy occurs.

SUMMARY OF THE INVENTION

Accordingly, it is an object of the present invention to provide a vertical field effect transistor which has overcome the above mentioned defect of the conventional one.

Another object of the present invention is to provide a vertical field effect transistor in which the current concentration is avoided, and therefore, the thermal destroy is prevented.

The above and other objects of the present invention are achieved in accordance with the present invention by a semiconductor device comprising a semiconductor substrate, an electrode pad for an external connection provided on a principal surface of the semiconductor substrate, a cell zone formed in the principal surface separately from the electrode pad, a plurality of transistors formed in the cell zone and connected in parallel to one another, and a plurality of diodes formed in the semiconductor substrate and arranged to form at least one array of diodes along at least one portion of an outer periphery of the cell zone, one electrode region of each of the diodes being formed of the semiconductor substrate.

In a preferred embodiment of the present invention, the transistors are vertical MOSFETs, and the electrode pad includes a source electrode pad connected to a source region of each of the vertical MOSFETs formed in the cell zone and a gate electrode pad connected to a gate electrode of each of the vertical MOSFETs formed in the cell zone. A drain electrode is formed on a rear surface of the semiconductor substrate. In addition, the plurality of diodes are arranged to form at least one army of diodes along an outer periphery of the cell zone so as to extend along an outer periphery of the gate electrode pad.

The above and other objects, features and advantages of the present invention will be apparent from the following description of preferred embodiments of the invention with reference to the accompanying drawings.

DESCRIPTION OF THE PREFERRED EMBODIMENTS

Figure 1A:
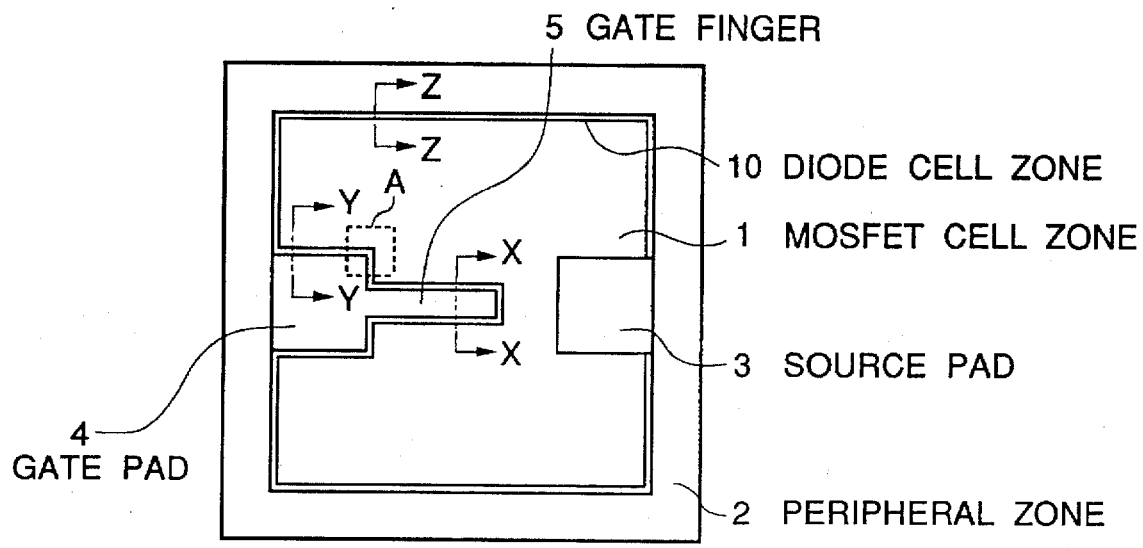
FIG. 1A is a diagrammatic layout pattern of a first embodiment of the vertical field effect transistor in accordance with the present invention.

Referring to FIG. 1A, there is shown a diagrammatic layout pattern of a first embodiment of the vertical field effect transistor in accordance with the present invention.

The shown vertical field effect transistor includes a MOSFET cell zone 1 in which a number of small vertical MOSFET cells are formed, a peripheral zone 2 completely surrounding the MOSFET cell zone 1 in order to ensure a withstanding voltage of the vertical field effect transistor, a source pad 3, a gate pad 4, a gate finger 5 extending from the gate pad 4 toward to the source pad 3 so as to prevent a gate series resistance, and a zone 10 formed to extend along an outer edge of the MOSFET cell zone 1 adjacent to the peripheral zone 2, the gate pad 4 and the gate finger 5. In the zone 10, a number of small diodes are formed.

Figure 1B:
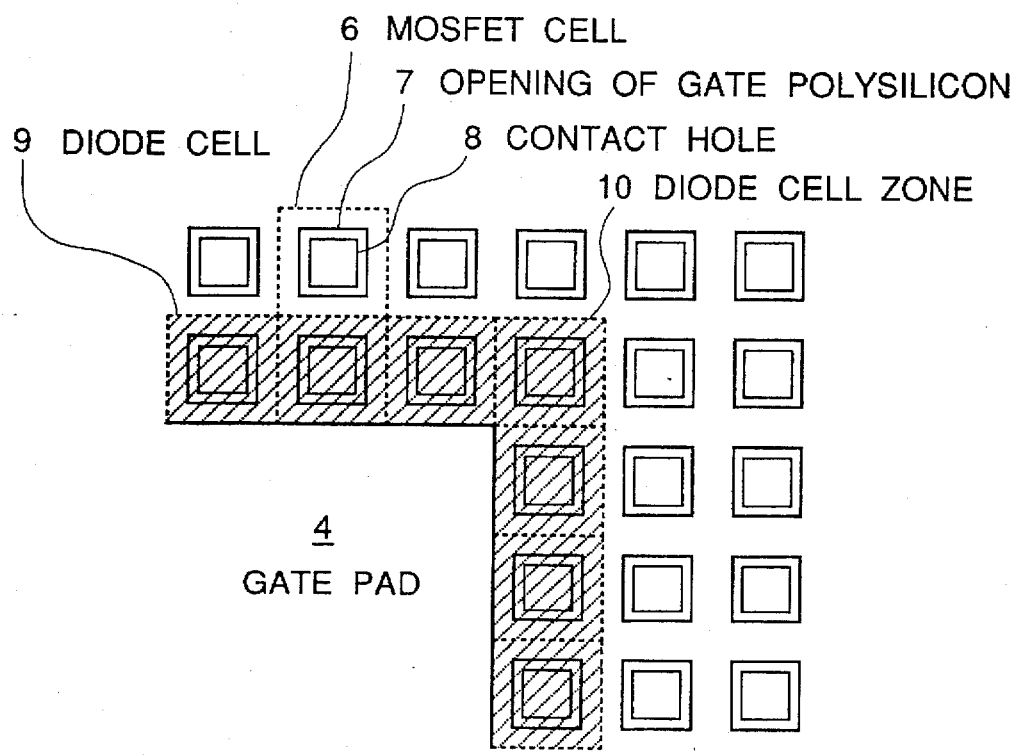
FIG. 1B is an enlarged view of a portion A in FIG. 1A.

Referring to FIG. 1B which is an enlarged view of a portion A in FIG. 1A, a number of small vertical MOSFET cells 6 are arranged in the form of a matrix within the MOSFET cell zone 1. In each of the MOSFET cells 6, an opening 7 is formed through a gate polysilicon layer, and a contact hole 8 is formed in the opening 7 for contacting with a source electrode layer. In addition, one array of diode cells 9 are formed so as to define the zone 10 extending along the periphery of the gate pad 4 and also extending along the periphery of the gate finger 5 and the peripheral zone 2 (not shown in FIG. 1B). An effect to be expected in the present invention can be obtained by providing only one array of diode cells 9, but a larger effect can be expected by providing two or three arrays of diode cells 9 if desired. On the other hand, no small vertical MOSFET cell is formed under each of the peripheral zone 2 and the gate pad 4 having the gate finger 5.

Figure 2A:
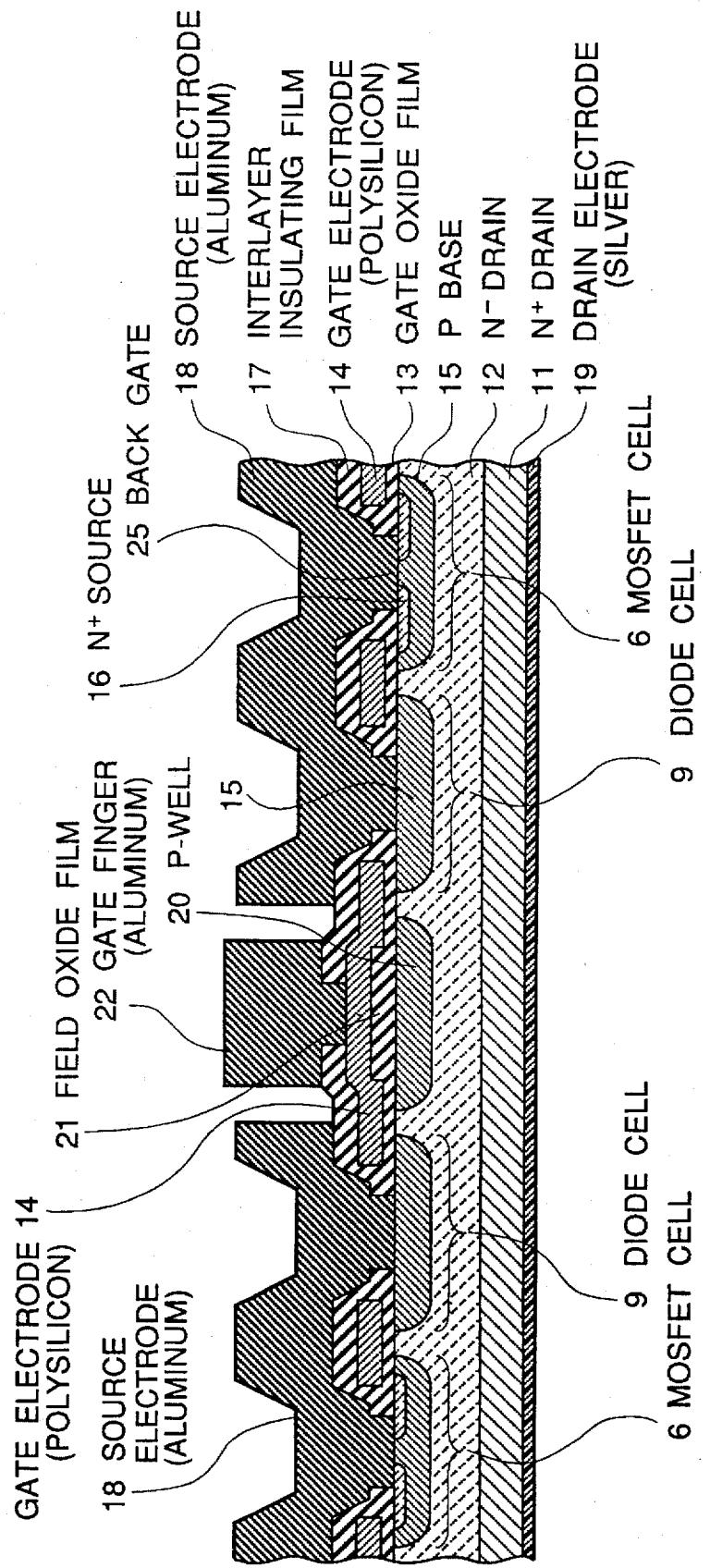
FIG. 2A is a sectional view taken along the line X—X in FIG. 1A.
Figure 2B:
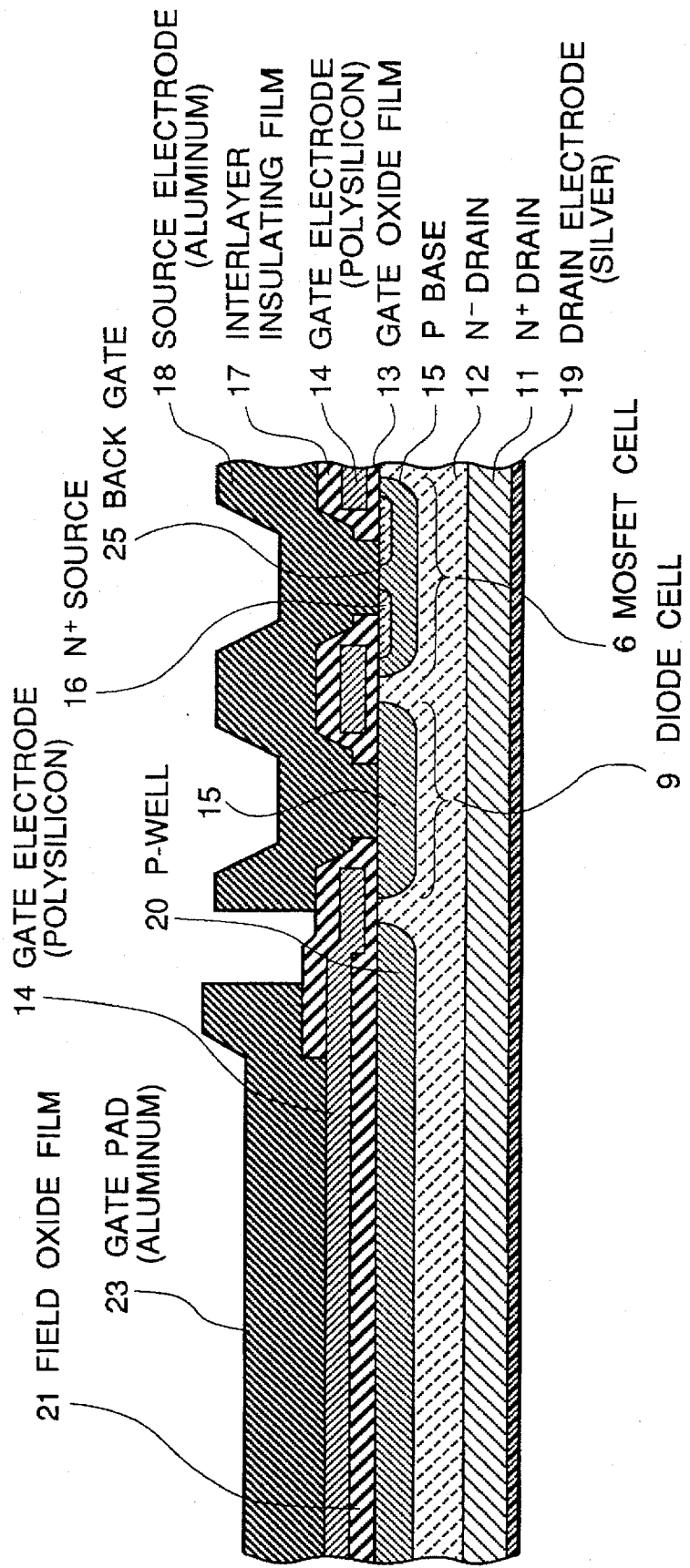
FIG. 2B is a sectional view taken along the line Y—Y in FIG. 1A.
Figure 2C:
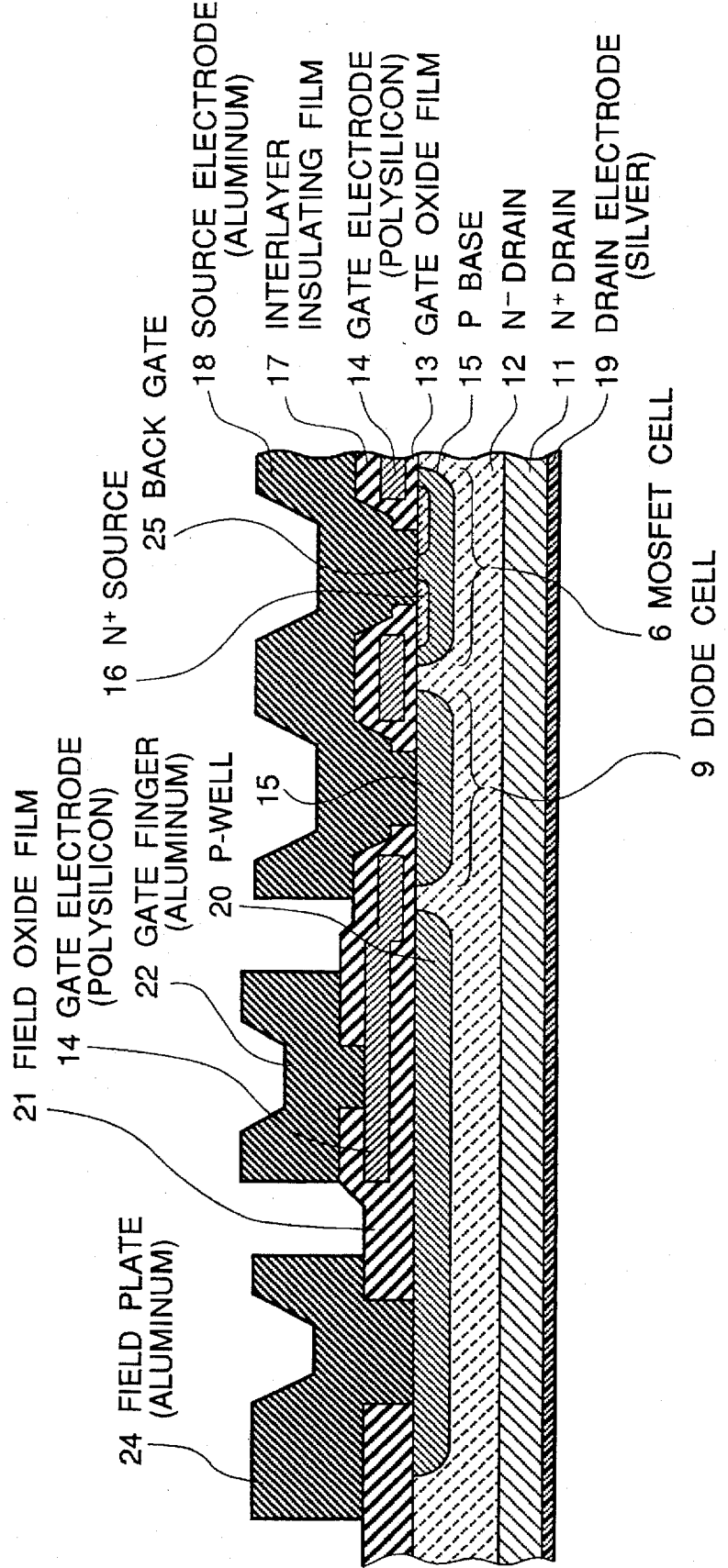
FIG. 2C is a sectional view taken along the line Z—Z in FIG. 1A.

Turning to FIGS. 2A, 2B and 2C, there are shown sectional views taken along the line X—X, the line Y—Y and the line Z—Z in FIG. 1A, respectively.

In the case of a N-channel vertical field effect transistor having a withstanding voltage of 60 V, for example, there is used a semiconductor substrate including an $N^+$ drain layer 11 doped with antimony at a concentration on the order of $2\times10^{18}/cm^3$, and an $N^-$ epitaxial layer ($N^-$ drain layer) 12 having a thickness of 12 μm and doped with phosphorus at a concentration on the order of $5.6\times10^{15}/cm^3$ so as to have a resistivity of 1Ω-cm.

At a surface region of the epitaxial layer 12 excluding the MOSFET cell zone 1, a P-well 20 is formed which has a depth of about 4 μm and a surface concentration of $1\times10^{18}/cm^3$. For example, this P-well 20 can be formed by ion-implanting borons at an implanting energy of 70 KeV and at a dose of $1\times10^{14}/cm^2$ using a patterned oxide film as a mask, and then by performing a heat treatment at 1200° C. for 60 minutes.

In the MOSFET cell zone, a gate oxide film 13 having a thickness of about 500 Å is formed, and a gate electrode 14 is formed on the gate oxide film 13. For example, the gate electrode 14 is formed of a polysilicon layer having a thickness of about 6000 Å and doped with phosphorus at a concentration on the order of $5\times10^{19}/cm^3$. In addition, a field oxide film 21 is formed to cover the P-well 20 and other regions.

On the other hand, a number of P-base regions 15 having a surface concentration of $1\times10^{18}/cm^3$, and a depth of about 3.5 μm are formed at constant intervals in the form of a matrix as shown in FIG. 1B. These P-base regions 15 can be formed by ion-implanting borons at an implanting energy of 70 KeV and at a dose of $9\times10^{13}/cm^2$ using the gate electrode 14 as a mask, and then by performing a heat treatment at 1140° C. for 180 minutes.

Within each of the base regions excluding one array of base regions which extend along the peripheral zone 2, the gate pad 4 and the gate finger 5 and in each of which a diode is to be formed, $N^+$ source regions 16 having a surface concentration of $1\times10^{20}/cm^3$ and a depth of about 1 μm are formed. These $N^+$ source regions 16 can be formed by ion-implanting phosphorus at an implanting energy of 80 KeV and at a dose of $5\times10^{15}/cm^2$ using, as a mask, a gate electrode 14 and a mask (not shown) which is used for formation of back gate 25 and a diode cell 9, and then by performing a heat treatment at 1000° C. for 30 minutes.

An interlayer insulating oxide film 17 is formed to cover the gate electrode 14. This interlayer insulating oxide film 17 contains about 8 mols of phosphorus and has a thickness of about 5000 Å. For example, this interlayer insulating oxide film 17 can be formed by a chemical vapor deposition (CVD).

Thereafter, necessary contact holes are formed, and an aluminum layer having a thickness of about 3.5 μm is formed by vapor deposition. The deposited aluminum layer is patterned to form a source electrode 18, a gate finger 22, a gate pad 23 and a field plate 24. On the other hand, a silver layer is formed on a rear surface of the semiconductor substrate so as to form a drain electrode 19.

In the above mentioned arrangement, no $N^+$ source region is formed in the diode cell zone 10, so that the source electrode 18 is in directly electrical contact with only the P-base region 15. Thus, a diode cell 9 is formed by the P-base region 15 and the $N^-$ drain layer 12.

In the above mentioned embodiment, the diode cells 9 are simply formed by utilizing the square MOSFET cells 6. However, it would be understood that the diode cells can be formed by utilizing stripe cells, rectangular cells or the like which are different from the square MOSFET cells 6, or their combination. In addition, the P-base region for the diode cells can be formed in the step of forming the P-well 20.

Figure 3:
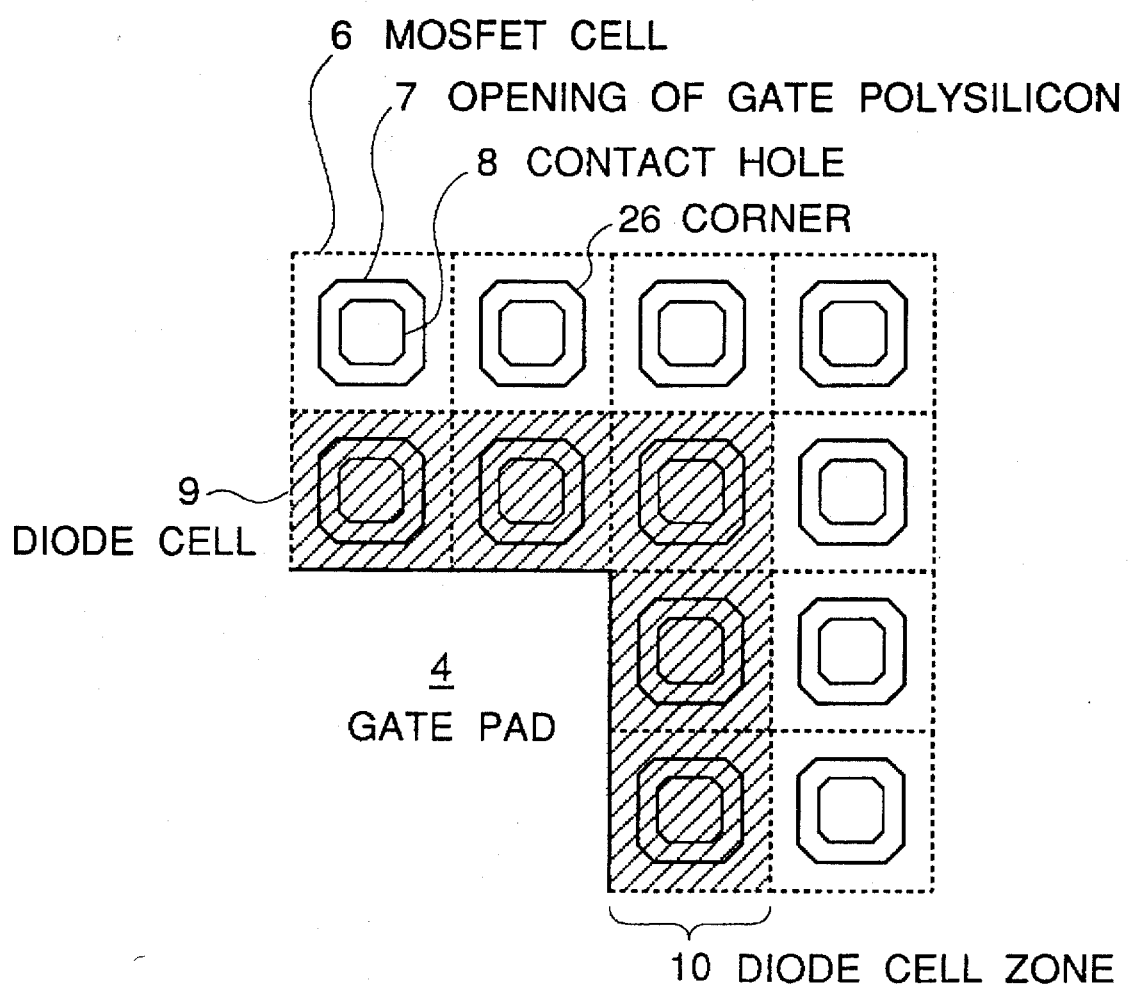
FIG. 3 is a view similar to FIG. 1B but showing a second embodiment of the vertical field effect transistor in accordance with the present invention.

Referring to FIG. 3, there is shown a second embodiment of the vertical field effect transistor in accordance with the present invention. Since FIG. 3 is a view similar to FIG. 1B, element similar to those shown in FIG. 1B are given the same Reference Numerals.

As will be seen from comparison between FIGS. 1B and 3, the second embodiment is characterized in that the gate electrode (polysilicon) opening 7 and the contact hole 8 of the MOSFET cells 6 and the diode cells 9 are octagonal. With the octagonal opening 7 of the gate electrode, it is possible to suppress decrease of the channel impurity concentration at corners of the opening 7.

The above mentioned embodiments have been an example of the N-channel vertical field effect transistor. However, the present invention can be similarly applied to a P-channel vertical field effect transistor.

As explained above, the embodiments of the vertical field effect transistor in accordance with the present invention is characterized in that at least one array of diode cells are located in a peripheral area of the MOSFET cell zone having a large operating resistance. Therefore, when a parasitic diode between the source and the drain is reversely recovered, minority carriers injected into the MOSFET cell zone are effectively drawn out through the diode cells. Accordingly, it is possible to prevent a turning-on of a parasitic NPN transistor of the MOSFET cells. As a result, a current concentration can be suppressed, and therefore, a breakdown voltage can be greatly improved.

For example, in the case of a N-channel vertical field effect transistor having a chip size of 4.5 mm square and a withstanding voltage of 60 V, an inclination of a reverse recovery voltage (dV/dt) between the drain and the source was measured by reversely recovering after a diode forward direction current of $I_F$=40 A is flowed. The breakdown voltage was about 3 V/ns in the conventional structure, but about 15 V/ns in the structure in accordance with the present invention. Namely, the breakdown voltage was increased to about five times.

In addition, if the gate polysilicon opening of the MOSFET cell is octagonal, the channel peak concentration at the corner is increased in comparison with the square opening, and therefore, the base resistance of the parasitic NPN transistor is suppressed at a low value, with the result that the breakdown voltage was further improved by about ten percents.

The invention has thus been shown and described with reference to the specific embodiments. However, it should be noted that the present invention is in no way limited to the details of the illustrated structures but changes and modifications may be made within the scope of the appended claims.

I claim:

1. A semiconductor device comprising:

a semiconductor substrate of a first conductivity type;

a source electrode pad and a gate electrode pad for making external connections, said pads being located on a principal surface of said semiconductor substrate, said source electrode pad and gate electrode pad being separate from each other;

a drain electrode formed to cover a rear surface of said semiconductor substrate;

a cell zone formed in said principal surface at a location which is separate from said source electrode pad and said gate electrode pad;

an insulating film on said principal surface of said semiconductor substrate;

contact holes formed through said insulating film;

a plurality of vertical MOSFET cells formed in said cell zone and connected in parallel with one another;

each of said vertical MOSFET cells including a drain region which is formed of said semiconductor substrate, in common with all of said vertical MOSFET cells; each of said cells further including a base region which is of a second conductivity type opposite to said first conductivity type and which is formed in said semiconductor substrate, each of said base regions being separate from the base regions of the other vertical MOSFET cells; a source region of said first conductivity type formed in each of said base regions; and a gate electrode formed adjacent to an individually associated one of said contact holes in said insulating film at least above each of said base regions and between the corresponding source region and said drain region; a channel created in a surface area of each of said base regions and between said corresponding source region and said drain region; each of said channels being controlled by an associated one of said gate electrodes; said source region of each of said vertical MOSFET cells being connected to a source electrode via an individually associated contact hole formed in said insulating film, said source electrode being connected to said source electrode pad; said gate electrode of each of said vertical MOSFET cells being connected to said gate electrode pad; and a plurality of diode cells formed in said semiconductor substrate and arranged to form only one array of diode cells along at least one portion of an outer periphery of said cell zone;

each of said diode cells having a first region of said first conductivity type formed of said semiconductor substrate and a second region of said second conductivity type formed in said semiconductor substrate; each of said second regions being separate from said second regions of the other diode cells and said base regions of said vertical MOSFET cells, and which is connected with said regions of the other diode cells and said base regions of said vertical MOSFET cells only with said source electrode via an individually associated contact hole formed in said insulating film; said second region of each of said diode cells and said base regions of said vertical MOSFET cells having the same impurity concentration and depth so that said diode cells and said vertical MOSFET cells have the same breakdown voltage, said second regions of said diode cells and said base regions of said vertical MOSFET cells being located at the same constant intervals so that said diode cells and said vertical MOSFET cells are located equal intervals; and said diode cells preventing a breakdown caused by a turn-on of a parasitic bipolar transistor of said MOSFET cells.

2. A semiconductor device comprising:

a semiconductor substrate of a first conductivity type;

a source electrode pad and a gate electrode pad for making external connections, said pads being located on a principal surface of said semiconductor substrate, said source electrode pad and gate electrode pad being separate from each other;

a drain electrode formed to cover a rear surface of said semiconductor substrate;

a cell zone formed in said principal surface at a location which is separate from said source electrode pad and said gate electrode pad;

an insulating film on said principal surface of said semiconductor substrate;

contact holes formed through said insulating film;

a plurality of vertical MOSFET cells formed in said cell zone and connected in parallel with one another;

each of said vertical MOSFET cells including a drain region which is formed of said semiconductor substrate, in common with all of said vertical MOSFET cells; each of said cells further including a base region which is of a second conductivity type opposite to said first conductivity type and which is formed in said semiconductor substrate, each of said base regions being separate from the base regions of the other vertical MOSFET cells; a source region of said first conductivity type formed in each of said base region; and a gate electrode formed adjacent to an individually associated one of said contact holes in said insulating film at least above each of said base regions and between the corresponding source region and said drain region; a channel created in a surface area of each of said base regions and between said corresponding source region and said drain region; each of said channels being controlled by an associated one of said gate electrodes; said source region of each of said vertical MOSFET cells being connected to a source electrode via an individually associated contact hole formed in said insulating film, said source electrode being connected to said source electrode pad; said gate electrode of each of said vertical MOSFET cells being connected to said gate electrode pad; and a plurality of diode cells formed in said semiconductor substrate and arranged to form only one array of diode cells along at least one portion of an outer periphery of said cell zone;

each of said diode cells having a first region of said first conductivity type formed of said semiconductor substrate and a second region of said second conductivity type formed in said semiconductor substrate; each of said second regions being separate from said second regions of the other diode cells and said base regions of said vertical MOSFET cells, and which is connected with said second regions of the other diode cells and said base regions of said vertical MOSFET cells only with said source electrode via an individually associated contact hole formed in said insulating film; said second region of each of said diode cells and said base regions of said vertical MOSFET cells having the same impurity concentration and depth so that said diode cells and said vertical MOSFET cells have the same breakdown voltage, said second regions of said diode cells and said base regions of said vertical MOSFET cells being located at the same constant intervals so that said diode cells and said vertical MOSFET cells are located equal intervals; and said diode cells preventing a breakdown caused by a turn-on of a parasitic bipolar transistor of said MOSFET cells;

the semiconductor device further including a peripheral zone formed to extend along a periphery of said semiconductor substrate so as to surround said cell zone, said source electrode pad and said gate electrode pad;

said peripheral zone including a region formed in said principal surface of said semiconductor substrate so as to extend along the periphery of said semiconductor substrate, said peripheral zone region being of a conductivity type opposite to that of said semiconductor substrate; a field plate formed on said principal surface of said semiconductor substrate so as to extend along the periphery of said semiconductor substrate, said field plate being connected to said peripheral zone region; and a gate finger formed so that it is surrounded by said field plate and on said principal surface of said semiconductor substrate so as to extend along the periphery of said semiconductor substrate, said gate finger being connected to said gate electrode pad; and wherein all of said plurality of diodes are arranged to form said only one array of diodes which extends along said outer periphery of said cell zone so as to extend along an outer periphery of said gate electrode pad and along an inner periphery of said peripheral zone.

* * * * *

UNITED STATES PATENT AND TRADEMARK OFFICE
CERTIFICATE OF CORRECTION

PATENT NO. :
DATED :  5,686,750
INVENTOR(S) :  November 11, 1997
Mitsuasa Takahashi It is certified that error appears in the above-indentified patent and that said Letters Patent is hereby corrected as shown below:

Title Page:
item [73] delete "Koshiba & Partners" and insert --NEC Corporation--

Signed and Sealed this

Twenty-sixth Day of December, 2000

Attest:

Q. TODD DICKINSON

Attesting Officer      Director of Patents and Trademarks